United States Patent
Imanishi

(10) Patent No.: US 7,612,497 B2
(45) Date of Patent: Nov. 3, 2009

(54) ORGANIC ELECTROLUMINESCENCE DEVICE AND ORGANIC ELECTROLUMINESCENCE SYSTEM

(75) Inventor: Yasuo Imanishi, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 364 days.

(21) Appl. No.: 11/431,655

(22) Filed: May 11, 2006

(65) Prior Publication Data
US 2006/0255722 A1    Nov. 16, 2006

(30) Foreign Application Priority Data
May 16, 2005    (JP)    ............... 2005-142255

(51) Int. Cl.
*H01J 1/62*    (2006.01)
*H01J 63/04*    (2006.01)
(52) U.S. Cl. .............. 313/504; 313/498; 313/506; 313/512
(58) Field of Classification Search ........... 313/498–512
See application file for complete search history.

(56) References Cited

U.S. PATENT DOCUMENTS 6,028,327 A * 2/2000 Mizoguchi et al. ............ 257/98

2004/0251815 A1* 12/2004 Tokailin et al. ............. 313/503
2004/0265622 A1* 12/2004 Sadasivan et al. ........... 428/690
2005/0003231 A1* 1/2005 Suzuki et al. ............... 428/690
2006/0132030 A1* 6/2006 Gao et al. .................... 313/511
2006/0186801 A1* 8/2006 West ........................... 313/506
2006/0273713 A1* 12/2006 Mehta et al. ................ 313/504

FOREIGN PATENT DOCUMENTS

JP    2001-223088    8/2001
JP    2001-223089    8/2001

* cited by examiner

*Primary Examiner*—Joseph L Williams
*Assistant Examiner*—Kevin Quarterman
(74) *Attorney, Agent, or Firm*—Antonelli, Terry, Stout & Kraus, LLP.

(57) ABSTRACT

An organic electroluminescence device is provided which employs a metal oxide electrode having particular composition distribution of elements to extend the life. A conventional approach for extending the life of an electroluminescence device is not provided by considering the degradation mechanism of how the organic electroluminescence device is degraded by the driving with electric current. The composite ratio of compounds of an electrode made of metal oxide forming part of the organic electroluminescence device is substantially uniform from a surface through which the carriers are injected from the electrode toward a deeper section in a bulk layer of the electrode. Thus, the electrode has stoichiometrically stable composition to prevent the degradation of electrode materials and diffusion into the organic layer, thereby providing a longer life.

7 Claims, 7 Drawing Sheets

(a)

(b)

ORGANIC ELECTROLUMINESCENCE DEVICE AND ORGANIC ELECTROLUMINESCENCE SYSTEM

FIELD OF THE INVENTION

The present invention relates to an organic electroluminescence device and an organic electroluminescence system, and more particularly, to an organic electroluminescence device with a thin film, a light weight, high definition, high efficiency, and a long life, preferable for use in a flat panel display, a small-size portable projection display, a display panel in a cellular phone, a three-dimensional display, an electric paper, a display in a portable personal computer, a real-time electronic signboard.

BACKGROUND OF THE INVENTION

In recent years, the widespread use of various types of cellular phones, mobile terminals, mobile computers, and car navigators has increased demands for lightweight, high-definition, high-brightness, and inexpensive small-size flat panel displays.

In households and offices, small-footprint desktop displays and flat panel displays such as wall-mounted televisions are replacing conventional CRT displays.

Particularly, with the proliferation of the high-speed Internet and the development of digital broadcasting, digital signal transmission at several hundred bits to several gigabits/sec has been put into practical use both in wired and wireless communication. Ordinary users are now beginning to exchange an extremely large amount of information in real time.

Under the circumstances, the flat panel displays require high-speed display operation suitable for digital signal processing in addition to a reduced weight, higher definition, higher brightness, and a lower cost than in conventional ones.

Liquid Crystal Displays (LDPs), Plasma Displays (PDPs), Field Emission Displays (FEDs) and the like are contemplated as the flat panel displays which meet the requirements. In addition to the various flat panel displays, attention is being focused on a new type of flat panel display, called an Organic Electroluminescence Device (OELD) or an Organic Light Emitted Diode (OLED).

The organic electroluminescence device achieves display by passing a current through an organic compound sandwiched between a cathode and an anode to cause light emission of fluorescent or phosphorescent organic molecules contained in the organic compound.

The studies of the organic electroluminescence device were conventionally centered on an organic semiconductor single crystal such as anthracene and perylene. In 1987, Tang et al. proposed a double-layered organic electroluminescence device formed by putting an emissive organic compound thin film on a hole-transport organic compound thin film to enable significant improvement in emission characteristics (an emission efficiency of 1.5 lm/W, a driving voltage of 10 V, and a brightness of 1000 $cd/m^2$), which was a milestone in the studies.

Thereafter, element technologies were researched and developed such as dye-doping, a polymer OLED, an electrode with a low work function, and a mask deposition method. In 1997, an organic electroluminescence device employing a carrier injection method called a passive matrix method came into practical use. Development of an organic electroluminescence device with a new carrier injection method called an active matrix method has been considered.

Such an organic electroluminescence device is driven on the following principles. Specifically, a fluorescent or phosphorescent organic emission material is formed as a thin film between a pair of electrodes to inject electrons and holes thereinto from the positive and negative electrodes.

In the organic emission material, the injected electrode serves as a one-electron state of organic molecule (hereinafter referred to simply as an "electron") entering the lowest unoccupied molecular orbital (LUMO) of the emissive molecule. The injected hole serves as a one-hole state of organic molecule (hereinafter referred to simply as a "hole") entering the highest occupied molecular orbital (HOMO) of the emissive molecule. They move toward the opposite electrodes in the organic substance, respectively.

If the electron encounters the hole during the movement, a singlet or triplet excited state of the emissive molecule is produced and then deactivated while radiating light, thereby emitting light.

In general, many organic emission materials are known to have high quantum efficiency in response to optical pumping as in various types of laser dyes. To cause the materials to emit light by carrier injection, a high voltage on the order of several hundreds of volts was necessary in the initial organic electroluminescence devices since many organic compounds are insulators with poor carrier transport of electrons and holes. The abovementioned double-layered organic electroluminescence device by Tang et al. improved the emission characteristics by taking advantage of the excellent carrier transport of an organic electrophotographic photosensitive material used as a photosensitive material of a copier and by providing the two layers having different functions, that is, a thin film for transporting carriers (holes) and a thin film for emitting light. Today, a three-layered organic electroluminescence device has been reported in which a third organic thin film is responsible for electron transport of the other electric charge.

Besides, organic electroluminescence devices having multiple layers for individual functions have been proposed. They have additional thin films responsible for various functions such as a carrier injection layer for improving the injection characteristic of holes and electrons into an organic substance and a hole blocking layer for increasing the recombination probability of the holes and electrons.

All of the devices use, as the base of the light emission, the light radiation in the process of deactivation of the excited state from the organic emission molecules contained in the organic emission layer.

Many known organic emission materials which emit fluorescent or phosphorescent light have been developed for various applications such as inks, pigments, and scintillators. These organic emission materials are used in the organic electroluminescence devices.

The materials are broadly classified into a low molecular type and a high molecular type in terms of molecular weight. The low molecular type is formed into a thin film through a dry process such as a vapor deposition method, while the high molecular type is formed into a thin film through a cast method.

One of the reasons why the initial organic electroluminescence device before the improvement made by Tang could not realize high efficiency is said to be the inability to form a favorable organic thin film. The low molecular type, particularly, requires the following conditions: (1) the ability to form a thin film (on the order of 100 nm) with the vapor deposition method, (2) the ability to maintain a uniform thin film structure (without crystallization) after the film formation, (3) a high fluorescence quantum yield in a solid state, (4) appropriate carrier transport, (5) thermal resistance, (6) easiness of purification, and (7) electro-chemical stability.

In some cases, the organic emission materials may be classified, in terms of emission process, into an emission material which emits light directly from a recombination of an electron and a hole and a fluorescent material (or dopant material) which emits light through light pumping produced from an emission material.

From the viewpoint of differences in chemical structures, known materials are classified into a metal-complex type emission material (8-quinolinol, benzoxazol, azomethine, flavone or the like as a ligand; Al, Be, Zn, Ga, Eu, Pt or the like as a central metal), and a fluorochrome-type emission material (oxadiazole, pyrazoline, distyrylallylen, cyclopentadien, tetraphenylbutadien, bis-styrylanthacene, perylene, phenanthrene, olig-thiophen, pyrazoloquinoline, thiadiazopyridine, layered perovskite, p-sexiphenyl, Spiro compound or the like).

A wide variety of studies have been made for the emission materials of the organic electroluminescence device and the process for forming the device. However, much remains unclear about the efficiency which the organic electroluminescence device can achieve in emitting light.

The light energy taken out of the organic electroluminescence device is given by the number of emitting photons per electron or hole passing through the device. When this is expressed with the external quantum efficiency $\eta\phi(ext)$ of electroluminescence, it is known that the following holds:

$$\eta\phi(ext)=\eta ext \times \eta\phi(int)=\eta ext \times [\gamma \times \eta r \times \eta f] \quad (1)$$

where $\eta\phi(int)$ represents the internal quantum efficiency which indicates the number of emitting photons per electron or hole passing through the device within the device, $\eta ext$ represents the out-coupling efficiency of light to the outside of the device after the light produced within the device is reduced by reflection and absorption at the interface of the device, $\gamma$ represents the charge balance which corresponds to the ratio between the numbers of electrons and holes injected into the device, $\eta r$ represents the generation efficiency which indicates the proportion of singlet exciton generated from the injected carriers that contributes to emission, and $\eta f$ represents the emission quantum efficiency which indicates the proportion of emission and deactivation in the singlet exciton.

The external quantum efficiency $\eta\phi(ext)$ corresponding to the amount of emission to the outside of the device can be broadly divided into $\eta r$ and $\eta f$ which are determined by the nature of the emission material itself, $\gamma$ which is determined by the ratio between the electrons and holes injected into the device, and $\eta ext$ which is determined by the structure of the device.

$\eta r$ and $\eta f$ are the efficiency relating to the property of the emission material itself and are determined uniquely by the emission material used. $\gamma$ is the value determined by the electric potential difference and the interface potential between electrodes and an organic layer in contact therewith, the mobility of electrons and holes within the organic layer, and the like, and is determined uniquely by the properties of the electrode material and the organic substance within the device.

Of the factors, the charge balance $\gamma$ is equal to or lower than one. The singlet exciton generation efficiency $\eta r$ is said to be equal to or lower than 0.25 in view of carrier spin. The emission quantum efficiency $\eta f$ is lower than one except in the super-radiative process. Thus, the part of the expression (1) determined by the organic substance within the device and the electrode material (the part [$\gamma \times \eta r \times \eta f$] in the expression (1)) is said to be equal to or lower than 0.25.

On the other hand, the out-coupling efficiency is determined by the laws of reflection and refraction of classical optics. Assuming that the refraction index of an emission layer is n, it is given by the following expression:

$$\eta ext=1/(2n^2) \quad (2)$$

The emission layers of many organic electroluminescence devices or glass substrates for holding them have a refractive index of approximately 1.6, and thus, $\eta ext$ may be equal to 0.2. From the above values, the external quantum efficiency of electroluminescence $\eta\phi(ext)$ is equal to or lower than 0.05(=0.2×0.25). In other words, the external quantum efficiency is 5% at most.

The factors which govern the efficiency of the organic electroluminescence device such as the charge balance, the exciton generation efficiency, the emission quantum efficiency, and the out-coupling efficiency can be enhanced to produce more light with less power. It can be expected that such improvement reduces the electric load on the device to extend the life thereof.

Several methods have been reported as means for extending the life of the organic electroluminescence device.

One of them is various means for protecting the electroluminescence device from outer moisture. For example, a light-curing resin can be applied to the outer surface of the device to provide protection from air.

An organic cover member and a glass material of a substrate can be surrounded by metal and brazed with appropriate metal having a lower melting point to prevent external air from entering from the end face of a sealing container.

An oxidation-resistant film made of aluminum or the like can be put on a cathode and serve as a second electrode to protect electrodes sandwiching an emission section.

Various means have been reported for providing a longer life through the use of an absorbent or improvement in element structure. For example, a moisture getter such as zeolite can be applied to the inside of a sealing container of an organic electroluminescence device.

In addition, heat transmission can be increased in a transparent substrate or a transparent substrate can be forcedly cooled. These approaches are provided to increase the life of a device by efficiently removing heat produced within the device.

Alternatively, various means have been reported for providing a longer life through increased durability of an organic layer material. For example, polyxylene can be used in a hole injection layer, a compound can be used which prevents crystallization in driving for a long time period, and a heat-resistant polyimide film can be used.

Also, a durable triphenylamine derivative can be used, and a durable diphenyl compound can be used.

In addition, an inorganic semiconductor can be used in a hole transport layer, and an anthracene derivative can be used.

In a disclosed example, adhesiveness between an organic layer and an electronic material can be enhanced to extend the life. For example, adhesiveness between an organic layer and an electrode can be improved by dispersing in the organic layer the same component as in the electrode in gradient concentration distribution.

A degradation preventing film which is not easily stripped such as polysilane can be interposed between ITO serving as an electrode and an emission layer.

Also, a higher efficiency and a longer life can be provided by reducing a voltage applied to electrodes. For example, a device with a longer life can be realized by stacking an inorganic amorphous hole injection layer, an inorganic electron-blocking layer, and an organic emission layer in order from an anode.

Corrosivity can be enhanced by coating the opposite side to a hole injection layer with metal having a high work function.

A longer life can be provided by effectively using an electric signal for driving. For example, a reverse bias can be applied after emission to prevent degradation.

The recombination probability of holes and electrons can be improved by increasing hole injection efficiency and providing an electron-blocking function in a hole transport layer to enhance electron transport on the cathode side than on the anode side.

A hole transport material can be dispersed in an emission layer or an electron transport layer to prevent degradation due to holes in the light emission layer or the electron transport layer, thereby extending the life.

$O_2$ plasma treatment can be performed on the surface of ITO to extend the life.

A longer life can be provided by optimizing a substrate temperature during vapor deposition of an organic layer in the electroluminescence device.

A longer life can be achieved by optimizing a duty-ratio not by simple d.c. operation.

In addition, Patent Documents 1 and 2 below describe that the ratio of $SnO_2$ to $In_2O_3$ of ITO serving as a transparent electrode is preferably 1 to 20% by mass, more preferably 5% to 12% by mass.

(Patent Document 1) JP-A-2001-223088
(Patent Document 2) JP-A-2001-223089

As described above, various methods have been proposed for providing a longer life.

BRIEF SUMMARY OF THE INVENTION

As described above, it is important to maintain the excellent emission characteristics for a long time, that is, to develop a technique for realizing a longer life of the organic electroluminescence device in putting the organic electroluminescence device into practical use.

Many techniques for realizing a longer life of the organic electroluminescence device previously studied are achieved by reducing driving power necessary for providing a required amount of light through an increase in efficiency of the device (the improved emission efficiency of the organic substance, the layer structure for increasing the charge balance, the reduced voltage due to a reduced potential gap between the electrode and organic layer, the use of the optical structure for increasing the out-coupling efficiency, the increased aperture through the use of a top-emission structure and the like).

These approaches, however, do not consider the degradation mechanism of how the organic electroluminescence device is degraded by the driving with electric current.

The present invention provides an optimal structure for peripheral members associated with an organic electroluminescence device to enhance the stability of the device structure itself to extend the life thereof, independently of the approaches for extending the life through the increased efficiency.

Specifically, we have focused on the material stability of members constituting the organic electroluminescence device and made various studies of optimal conditions to provide material composition which would not be deteriorated after the passing of electric current over the longest time period.

The optimal condition range changes with various surface treatments during a series of steps for forming the organic electroluminescence device. A certain condition may go out of the range in the process until the final device is formed.

Thus, it is important to achieve the conditions immediately before the formation of the final device, and only the material composition in the early phase of the manufacturing process is not critical. The present invention also provides a verification method for determining whether or not the members of the completed organic electroluminescence device fall within the optimal condition range.

The present invention provides the following means for providing a longer life of the organic electroluminescence device.

Specifically, the prevent invention provides an organic electroluminescence device including at least one thin film layer sandwiched between electrodes, at least one of the thin film layers being an organic emission layer or a fluorescent or phosphorescent layer, positive and negative carriers being injected through the electrode into and transported in the organic emission layer to cause the organic emission layer to generate light with recombination of a hole and an electron produced from the positive and negative carriers, the fluorescent layer or phosphorescent layer receiving light from the organic emission layer to generate light secondarily, at least one of the electrodes being made of metal oxide into which the carrier is injected, wherein a composite ratio of compounds from a surface through a bulk layer of the electrode made of the metal oxide is uniform.

In the organic electroluminescence device, a composite ratio of compounds of all elements other than an element contained within attached materials to a surface of the electrode made of the metal oxide is substantially uniform from the surface through which the carriers are injected from the electrode toward a deeper section in the bulk layer.

In the organic electroluminescence device, the bulk layer has a depth of 6 nm or smaller from the surface through which the carriers are injected from the electrode.

In the organic electroluminescence device, the metal oxide of the electrode is made of any one of metal elements selected from the group consisting of In, Sn, Zn, Fe, Co, Sr, Cu, Ag, Pt, W, and Ni.

In the organic electroluminescence device, light transmittance of light is 30% or higher in a visible light area of the electrode.

In the organic electroluminescence device, the electrode has a sheet resistivity of 50 $\Omega/cm^2$ or lower.

In the organic electroluminescence device, a surface roughness of the electrode is 1 nm or more and is smaller than a film thickness of a thin film layer formed in contact with the metal oxide of the organic electroluminescence device. This is set because a leak is caused by a surface roughness larger than the thickness of the organic layer formed immediately above the electrode made of the metal oxide.

In the organic electroluminescence device, the electrode has a work function of 5.0 eV or lower.

In the organic electroluminescence device, light transmittance of light is 30% or higher in a visible light area of the electrode, or the electrode has a sheet resistivity of 50 $\Omega/cm^2$ or lower, or a surface roughness of the electrode is 1 nm or more, or the electrode has a work function of 5.0 eV or lower.

The present invention provides an organic electroluminescence system including matrix-arrayed organic electroluminescence devices, the organic electroluminescence device comprising at least one thin film layer sandwiched between electrodes, at least one of the thin film layers being an organic emission layer or a fluorescent or phosphorescent layer, positive and negative carriers being injected through the electrode into and transported in the organic emission layer to cause the organic emission layer to generate light with recombination of a hole and an electron produced from the positive and negative carriers, the fluorescent layer or phosphorescent layer receiving light from the organic emission layer to generate light secondarily, at least one of the electrodes being made of metal oxide into which the carrier is injected, wherein a composite ratio of compounds from a surface through a bulk layer of the electrode made of the metal oxide is uniform.

Other objects, features and advantages of the invention will become apparent from the following description of the embodiments of the invention taken in conjunction with the accompanying drawings.

(Description of Reference Numerals)

Figure 1:
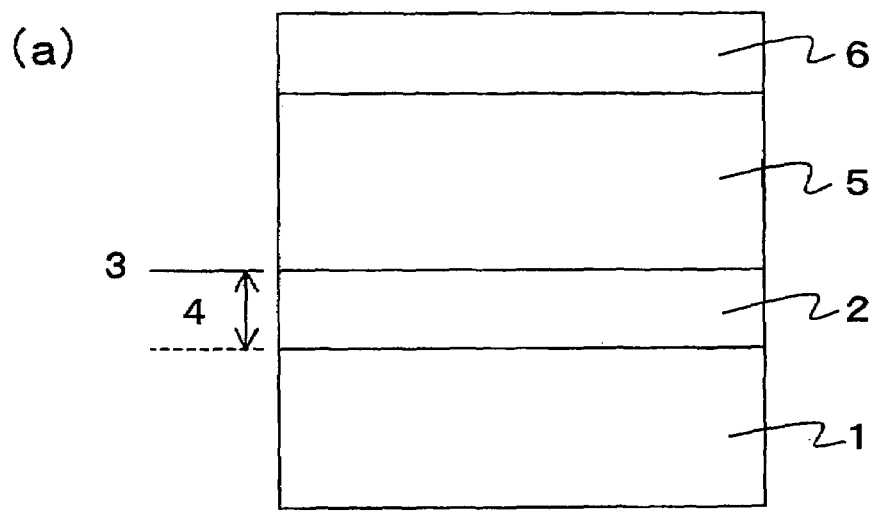
FIG. 1(a) shows the basic structure of an organic electroluminescence device according to the present invention.
FIG. 1(b) is a graph showing a composite ratio of an electrode.
Figure 1:
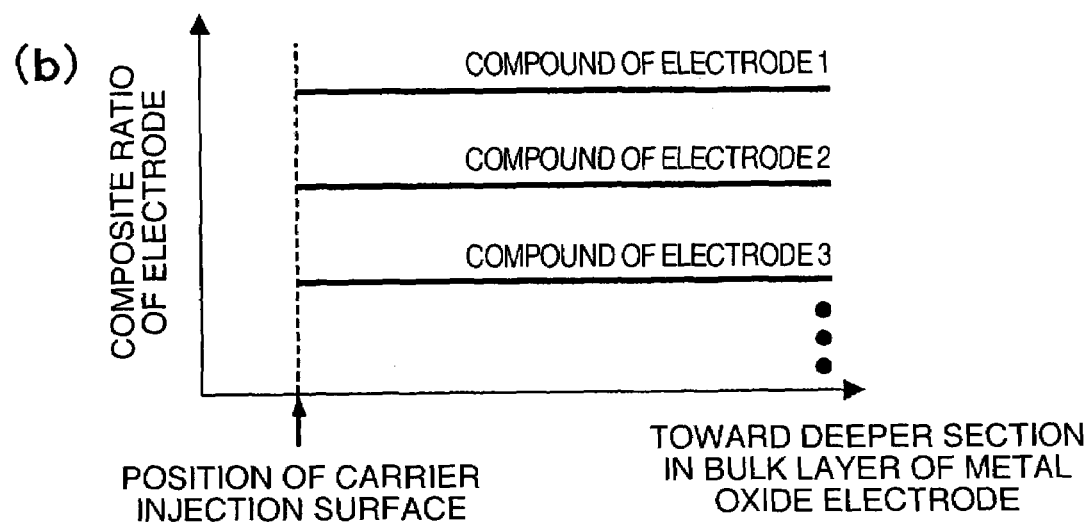

| | |
|---|---|
| 1 | SUBSTRATE |
| 2 | METAL OXIDE ELECTRODE |
| 3 | CHARGE INJECTION SURFACE |
| 4 | BULK LAYER IN METAL OXIDE ELECTRODE |
| 5 | ORGANIC SUBSTANCE-CONTAINING THIN FILM LAYER |
| 6 | SECOND ELECTRODE |
| 7 | SUBSTRATE |
| 8 | METAL OXIDE ELECTRODE |
| 9 | HOLE INJECTION LAYER |
| 10 | HOLE TRANSPORT LAYER |
| 11 | EMISSION LAYER |
| 12 | ELECTRON TRANSPORT LAYER |
| 13 | ELECTRON INJECTION LAYER |
| 14 | OPPOSITE ELECTRODE |
| 15 | CHARGE INJECTION LAYER |
| 16 | BULK LAYER IN METAL OXIDE ELECTRODE |
| 17 | ORGANIC SUBSTANCE-CONTAINING THIN FILM LAYER |
| 18 | SECOND ELECTRODE |
| 19 | SUBSTRATE |
| 20 | METAL OXIDE ELECTRODE |
| 20' | PATTERNED METAL OXIDE ELECTRODE |
| 21 | ORGANIC SUBSTANCE-CONTAINING THIN FILM LAYER |
| 22 | SECOND ELECTRODE |
| 23 | SEALING CONTAINER |
| 28 | PRETREATMENT CHAMBER |
| 29 | ORGANIC CHAMBER |
| 30 | METAL CHAMBER |
| 31 | PASSING BOX |
| 32 | SEALING BOX |
| 33 | SUBSTRATE INLET |

-continued (Description of Reference Numerals)

| | |
|---|---|
| 34, 34' | TRANSFER ROD |
| 35 | GATE VALVE |
| 36 | DEVICE OUTLET |
| 37 | HIGH-FREQUENCY ELECTRIC POWER SOURCE |
| 38 | MATCHING BOX |
| 39 | PRETREATMENT CHAMBER |
| 40 | SUBSTRATE HOLDING MECHANISM |
| 41, 41', 41" | GATE VALVE |
| 42 | GAS REGULATOR |
| 43 | GAS CYLINDER |

DETAILED DESCRIPTION OF THE INVENTION

The organic electroluminescence device herein mentioned is formed to include an emission layer containing organic emission molecules, in which holes can be injected from an anode electrode and electrons can be injected from a cathode electrode into the emission layer, and light can be emitted through recombination of the holes and electrons within the emission layer. The emission layer may be formed of a single layer or a plurality of layers.

The emission layer may contain, in addition to the organic emission molecules which radiate light through the recombination of the holes and the electrons, a fluorescent material (or a phosphorescent material) capable of absorbing the light produced from the organic emission molecules to produce different light.

The emission layer may contain a hole transport material or an electron transport material capable of increasing the mobility of the hole or electron within the emission layer.

The emission layer may contain a hole capture material or an electron capture material for capturing the hole or electron at a particular spatial position or for reducing the transport.

The organic emission molecules, the fluorescent material (or the phosphorescent material), the hole transport material, the electron transport material, the hole capture material, and the electron capture material may be contained together in the same layer or separately in different layers.

In the present invention, even when these constituent materials are contained separately in a plurality of layers, the layers are collectively referred to as an emission layer.

It is possible to provide a hole injection layer or an electron injection layer for improving the injection efficiency of the holes or electrons between the emission layer of the present invention and an anode or a cathode for injecting the holes or electrons into the emission layer.

It is also possible to provide a substrate for holding the emission layer, the anode, the cathode, the hole injection layer, and the electron injection layer, or to provide an intermediate layer as appropriate other than them.

Such intermediate layers include a reflecting mirror or a partially transmitting mirror for modulating the reflecting characteristic of light, a filter for transmitting particular light, an optical switch for adjusting the emission timing of light, a wavelength plate for adjusting the phase property of light, a diffusion plate for diffusing the emission direction of light, and a protective film for preventing degradation of the materials forming the device due to external light, heat, oxygen, moisture or the like.

These intermediate layers may be provided as appropriate next to the emission layer, the anode, the cathode, the hole injection layer, the electron injection layer, and the substrate, or outside them, such that significant degradation of the device characteristics can be avoided. Particularly, a layer on the outermost side through which light is sent outside from the organic electroluminescence device is called an out-coupling outermost layer.

Electroluminescence materials usable in the present invention include various metal-complex type emission materials (8-quinolinol, benzoxazol, azomethine, flavone or the like as a ligand; Al, Be, Zn, Ga, Eu, Ru, Pt or the like as a central metal) and fluorochrome-type emission materials (oxadiazole, pyrazoline, distyrylallylen, cyclopentadien, tetraphenylbutadien, bis-styrylanthacene, perylene, phenanthrene, olig-thiophen, pyrazoloquinoline, thiadiazopyridine, layered perovskite, p-sexiphenyl, spiro compound or the like).

Alternatively, various polymer materials (polyphenylenevinylene, polyvinylcarbazole, polyfluorene, or the like) can be used as an emission material, or non-emission polymer materials (polyethylene, polystyrene, polyoxiethylene, polyvinylalcohol, polymethylmethacrylate, polymethylacrylate, polyisoprene, polyimide, polycarbonate or the like) can be used as a matrix to mix or copolymerize various emission materials or fluorescent materials.

It is possible to interpose various organic hole or electron transport materials (triphenylamine or the like). In addition, it is possible to interpose various hole and electron injection layers (for example, Li, Ca, Mg, Cs, CuPc or the like). Some of the materials can be selected as appropriate for the device structure.

Methods for forming the organic electroluminescence device of the present invention include various thin film forming techniques, for example, spin-coating, coating, casting, sputtering, vapor deposition, molecular beam deposition, liquid phase epitaxy, atomic layer epitaxy, roll-to-roll, screen printing, ink-jet printing, electric polymerization, rubbing, spray, water-surface expansion, and Langmuir-Blodjett film.

To promote orientation during and after the film formation, it is possible to use a crystalline substrate having an orientation regulating property, a substrate having an orientation film applied thereto, or a substrate subjected to physical or chemical surface treatment.

A molecule frame showing liquid crystallinity during orientation treatment is desirable for compounds suitable for the orientation treatment. After the orientation treatment, the orientation state is effectively fixed by cooling the temperature to a glass transition temperature or lower or by forming a new chemical bond between molecules from reaction with light or heat.

As the substrate, it is possible to use a substrate made of an inorganic substance such as glass, silicon, and gallium arsenide, a substrate made of an organic substance such as polycarbonate, polyethylene, polystyrene, polypropylene, and polymethylmethacrylate, or a substrate made of a combination of both materials.

These substrates can be formed by methods such as cutting from the base material and polishing, injection molding, sandblast, and dicing.

It is possible to use a substrate having a thin film transistor formed thereon to control light emission. It is also possible to form an organic electroluminescence layer on a substrate having a thin film transistor formed thereon, or to form separately a substrate having a thin film transistor formed thereon and a substrate having an organic electroluminescence layer formed thereon and then bond them together.

The organic electroluminescence device of the present invention can employ various high-precision manufacturing techniques for forming a necessary optical device structure during the formation of the device. For example, the techniques include high-precision diamond-cutting, laser manufacturing, etching manufacturing, photolithography, reactive ion etching, and focused ion beam etching.

A plurality of previously processed organic electroluminescence devices can be arranged, multi-layered, bonded together with optical waveguides between them, or sealed in that state.

The device can be stored in a container filled with inert gas or inert liquid. In addition, a cooling or heating mechanism may be used together for adjusting the operational environment.

The container may be made of various metals such as copper, silver, stainless-steel, aluminum, brass, iron, and chrome, and an alloy thereof, or a composite material formed by dispersing the abovementioned metals in a polymer material such as polyethylene and polystyrene, and a ceramic material.

As a heat block layer, it is possible to use Styrofoam, porous ceramic, a glass fiber sheet, paper, and the like. Particularly, coating can be performed to prevent condensation.

The inert liquid filing the container may be liquid such as water, deuterated water, alcohol, wax with a low melting point, mercury, and a mixture thereof.

The inert gas filling the container may be helium, argon, nitrogen and the like. A drying agent may be put in the container to reduce the humidity.

The organic electroluminescence device of the present invention can be subjected to treatment for improving the outer appearance and characteristic and providing a longer life after the completion of the formation as the product.

Such post-treatment includes thermal annealing, irradiation of radiant ray, irradiation of electron beam, irradiation of light, irradiation of electric wave, irradiation of magnetic wave, irradiation of ultrasonic wave, and the like.

A plurality of the organic electroluminescence devices can be combined with each other by using various means appropriate for the use or intent such as adhesion, fusion, electrocoat, deposition, pressure bonding, dyeing, fusion molding, mining, press molding, and coating.

The organic electroluminescence device of the present invention can be placed close to an electronic circuit for driving the device to realize high-density packaging, or can serve as an interface for transmission and reception of signals to and from the outside.

EXAMPLES

Examples of the present invention will hereinafter be described with reference to the drawings.

Example 1

First, description will be made of the basic structure of an organic electroluminescence device according to the present invention.

FIG. 1(a) shows the basic structure of the organic electroluminescence device according to the present invention. The organic electroluminescence device is formed on a substrate (1). By way of example, a metal oxide electrode (2) is formed immediately above the substrate (1).

A thin film layer (5) containing an organic substance is formed on the metal oxide electrode (2). A second electrode (6) different from the metal oxide electrode (2) is formed on the layer (5).

The organic substance-containing thin film layer (5) is shown as a single layer in FIG. 1(a) for simplicity. In reality, however, it may be formed as a multi-layered structure consisting of various thin films (such as an organic thin film, an inorganic thin film, and an organic-inorganic composite thin film) as known in many organic electroluminescence devices.

The second electrode (6) can be made of already known metal (for example, Al, Ag, Au, In, MgAg, Ca, Cs, W, MoW, and Cu) or metal oxide (such as ITO and IZO).

The organic substance-containing thin film layer (5) is sandwiched between the metal oxide electrode (2) and the second electrode (6) serving as two electrodes which inject positive and negative carriers.

The carriers are injected into the layer (5) from the metal oxide electrode (2) through a carrier injection surface (3) in FIG. 1(a). The portion of the metal oxide electrode (2) under the surface (3) is referred to as a metal oxide electrode bulk layer (4) which is an area below the carrier injection surface (3) in FIG. 1(a).

The present invention is best characterized in that the composite ratio, which is the ratio of compounds forming the metal oxide electrode (2), is uniform from the carrier injection surface (2) through the metal oxide electrode bulk layer (4). FIG. 1(b) schematically shows the characteristic.

FIG. 1(b) shows the relationship between the position in the direction across the metal oxide electrode bulk layer and the composite ratio of electrode compounds 1 to 3. The composite ratio of the electrodes is uniform in the direction across the metal oxide electrode bulk layer from the position of the carrier injection surface.

It is important to form the organic electroluminescence device having the uniform composite ratio of electrode near the surface. In the actual manufacturing process, it is important to establish a means for holding a uniform composite ratio to the electrode surface at nano-scale, and a uniform composite ratio is desirably maintained in an allowed range.

The present invention specifically provides the allowed range as a result of close investigations. The present invention also provides a minimum range of deepness in which the composite ratio should be uniform.

Description will hereinafter be made of a specific example of the manufacturing of an organic electroluminescence device having a metal oxide electrode which satisfies the requirements as well as the verification of the effects of the device with reference to FIG. 2. However, the effects of the present invention are not limited only to those provided by the specific components of the device shown below.

The result obtained from the use of the most representative metal oxide electrode of the organic electroluminescence device, Indium Tin Oxide (ITO), is shown.

Figure 2:
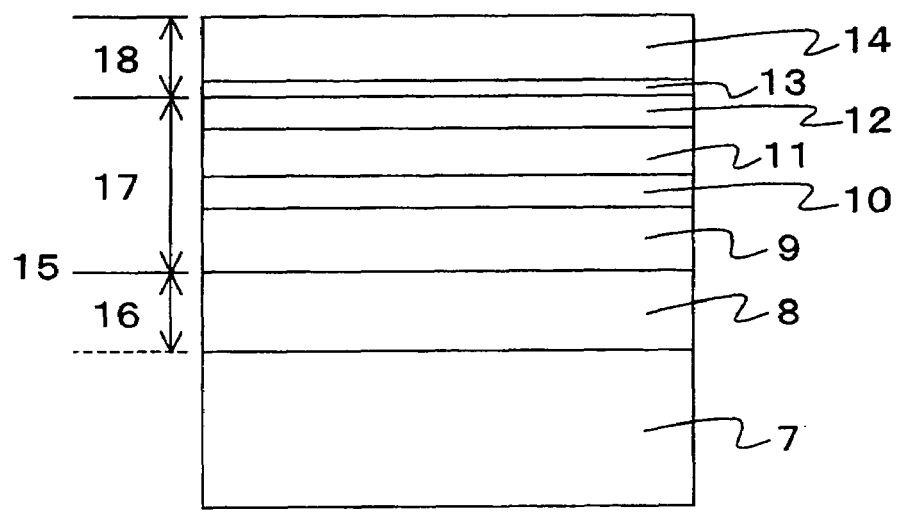
FIG. 2 specifically shows the structure of the organic electroluminescence device according to the present invention.

In FIG. 2, borosilicate glass AN 100 (with a thickness of 0.7 mm) manufactured by Asahi Glass Co., Ltd. was used for a substrate (7).

The ITO was used for a metal oxide electrode (8). The ITO used was formed by proprietary sputter equipment, later described.

An organic substance-containing thin film layer (17) was formed as an organic multi-layered film consisting of four layers, that is, a hole injection layer (9), a hole transport layer (10), an emission layer (11), an electron transport layer (12), from the side closer to the metal oxide electrode (8).

The hole injection layer (9) was made of a typical material with a thickness of 90 nm. The hole transport layer (10) was also made of a typical material with a thickness of 10 nm. The emission layer (11) was made of a typical host material and a typical dopant material with a weight concentration of the dopant of 5% to the host and a thickness of 40 nm.

The electron transport layer (12) was made of a compound $Alq_3$ manufactured by Nippon Steel Chemical Co, Ltd. with a thickness of 20 nm.

A second electrode (18) was formed as an inorganic multi-layered film consisting of two layers, that is, an electron injection layer (13) and an opposite electrode (14) from the side closer to the organic substance-containing thin film layer (17).

The electron injection layer (13) was made of a compound LiF (purity of 4 N) manufactured by Rare Metallic Co, Ltd. with a thickness of 0.5 nm. The opposite electrode (14) was made of a compound Al (purity of 6 N) manufactured by Rare Metallic Co., Ltd. with a thickness of 150 nm.

Next, the overall flow of the manufacturing process of the device will be described with reference to FIG. 3 to FIG. 5.

First, at step 1, a commercially available glass substrate (19) was prepared and then cleaned by using a cleaning solution provided by diluting a neutral detergent (Clean Ace S manufactured by As One Corporation) with ten parts of pure water.

Then, the substrate (19) was subjected to washing with pure water, washing with running pure water, and ultrasonic cleaning with pure water. Next, the substrate (19) was dried and stored in a dedicated substrate dry room of class 100. Immediately before step 2 for forming a metal oxide electrode, the substrate (19) was subjected to surface cleaning treatment in irradiation equipment of ultrasonic ray (irradiation equipment of ultrasonic ray KAH-08101-2652 manufactured by Toshiba Corporation).

Next, at step 2 which is characteristic of the present invention, a metal oxide electrode (20) was formed on the cleaned substrate (19) in sputtering thin film deposition equipment dedicated to ITO formation (DC magnetron sputter equipment: a power density of 1 $W/cm^2$, a partial pressure of oxygen of 1%, a pressure of 0.7 Pa, and a deposition rate of 10 nm/min).

A target material manufactured by Japan Pure Chemical Co., Ltd. was used for the sputter target. An ITO thin film was formed over the entire surface of the substrate. Then, the substrate was baked in a dedicated baking furnace at 200° C. for 8 hours to change the amorphous state immediately after the sputtering into a polycrystalline state. FIG. 3 shows the ITO in this state as the metal oxide electrode (20).

Then, at step 3 for patterning the metal oxide electrode (20), a photoresist film was formed on the metal oxide electrode (20) through spin-coating and then cured by irradiation of ultrasonic ray with a predetermined photomask put thereon to leave a metal oxide electrode (20') in the pattern shown in FIG. 4(a). The uncured photoresist was removed by remover liquid of resist. The portion of the metal oxide electrode (20) outside the pattern was removed by etching liquid. Finally, the cured photoresist was also removed by another remover liquid of resist.

Step 3 is a standard ITO patterning step. Although the used equipment or reagent was not described particularly, it is not limited to a specific patterning method.

The metal oxide electrode (20') thus patterned was subjected to scribing cleaning with a neutral detergent, then washing with pure water, washing with running pure water, ultrasonic cleaning with pure water, vapor washing with isopropanol, and megasonic spin cleaning with pure water, and then dry in a dedicated dry room, followed by irradiation of ultraviolet ray immediately before the use, before transition to the next step. The metal oxide electrode (20') after the patterning was provided at the point.

Next, at step 4, an organic substance-containing thin film layer (21) was formed. Specifically, vapor deposition equipment (organic EL forming equipment CM-29GL manufactured by Tokki Corporation) was used.

Figure 5:
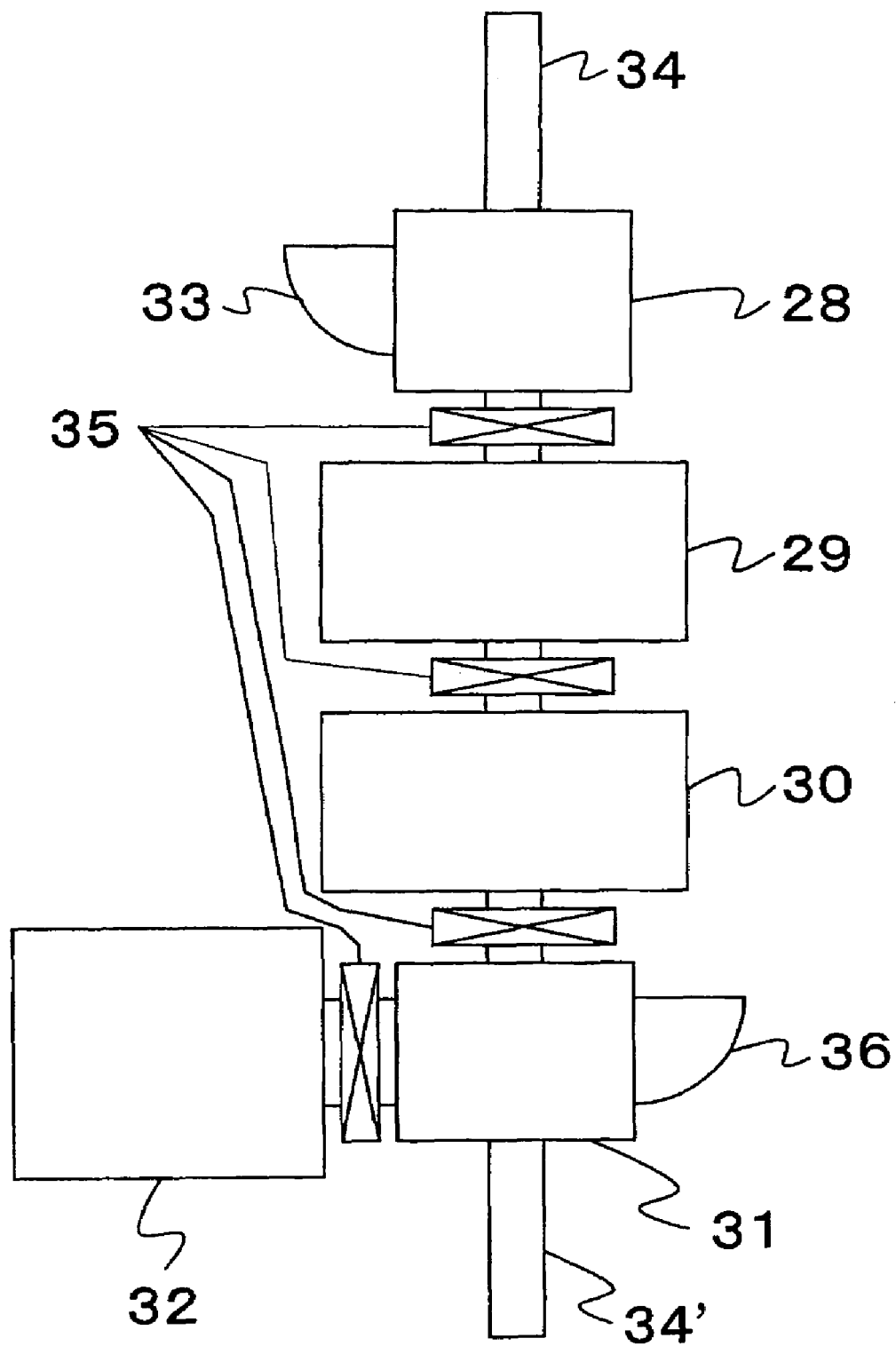
FIG. 5 shows the arrangement of equipment for forming the organic electroluminescence device according to the present invention.

FIG. 5 schematically shows the vapor deposition equipment. The vapor deposition equipment is broadly formed of a pretreatment chamber (28) which can receive the substrate having the patterned metal oxide electrode (20') formed thereon to perform plasma treatment on the substrate surface, an organic chamber (29) in which the organic substance-containing thin film layer can be formed through vapor deposition, a metal chamber (30) in which a second electrode can be formed through vapor deposition, a sealing box (32) for sealing the substrate after the formation of the second electrode thereon, and a passing box (31) for passing the substrate to the sealing box (32) or putting the device after the sealing to the outside.

The respective chambers and boxes are partitioned by gate valves (35). Particularly, the substrate is transferred between the pretreatment chamber (28), the organic chamber (29), the metal chamber (30), and the passing box (31) by using a transfer rod (34, 34') with the vapor state maintained.

After the substrate having the metal oxide electrode (20') formed thereon is put into the pretreatment chamber (28) through a substrate inlet (33), the chamber (28) is immediately evacuated to the base pressure of $5\times10^{-5}$ Pa. The plasma treatment is performed on the substrate while various carrier gasses are flowed within the pretreatment chamber (28), or the substrate is transferred to the organic chamber (29) (at a base pressure of $1\times10^{-5}$ Pa) without any treatment performed thereon.

In the organic chamber (29), the organic substance-containing layer (21) is evaporated under predetermined conditions. In the vapor deposition, a metal mask (SUS manufactured by Sonocom Co., Ltd. with a thickness of 1 mm) having an opening patterned to allow attachment of the material to be deposited only in a particular area on the substrate is disposed in close contact with the surface of the metal oxide electrode (20'). In this manner, the organic substance-containing thin film layer (21) is formed as shown in FIG. 4(b). In the present Example, the organic substance-containing thin film layer (21) is formed of four organic layers. However, a multi-layered structure of up to six layers can be formed in the device.

In the structure shown in FIG. 2 described above, the hole injection layer (9), the hole transport layer (10), the light emission layer (11), and the electron transport layer (12) were deposited sequentially in order from the side closer to the substrate (7). As a matter of course, the number of the layers is not limited to the maximum number of stacked layers resulting from a particular device structure.

Returning to FIG. 3, a second electrode (22) was formed at step 5. The substrate, which had undergone the step of the formation of the organic substance-containing thin film layer (21) at step 4, was transferred from the organic chamber (29) to the metal chamber (30) (at a base pressure of $1\times10^{-5}$ Pa) shown in FIG. 5 without breaking the vacuum.

In the metal chamber (30), the predetermined second electrode (22) was evaporated while a metal mask having a patterned opening was disposed in close contact with the organic substance-containing thin film layer (21) similarly to the formation of the organic substance-containing thin film layer (21). In this manner, the second electrode (22) shown in FIG. 4 was formed. In the metal chamber (30), up to six vaporization sources can be used for deposition.

In the structure in FIG. 2 described above, the electron injection layer (13) and the opposite electrode (14) are sequentially evaporated and stacked over the electron transport layer (12).

Figure 3:
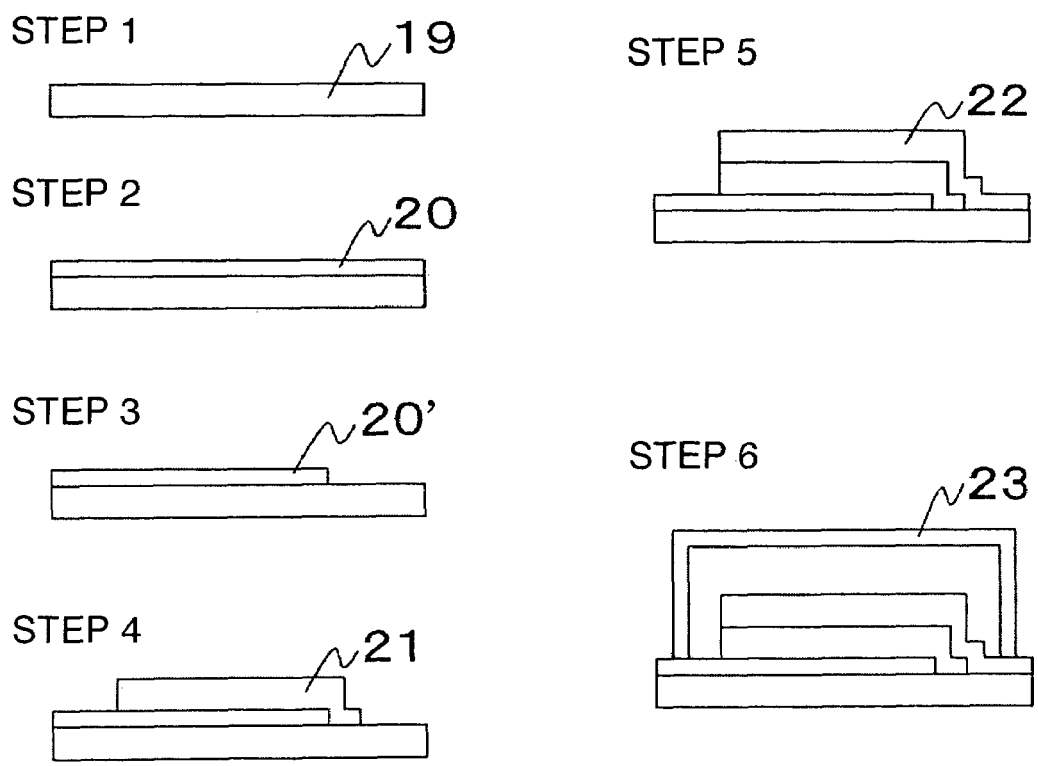
FIG. 3 shows steps for forming the organic electroluminescence device according to the present invention.
Figure 4:
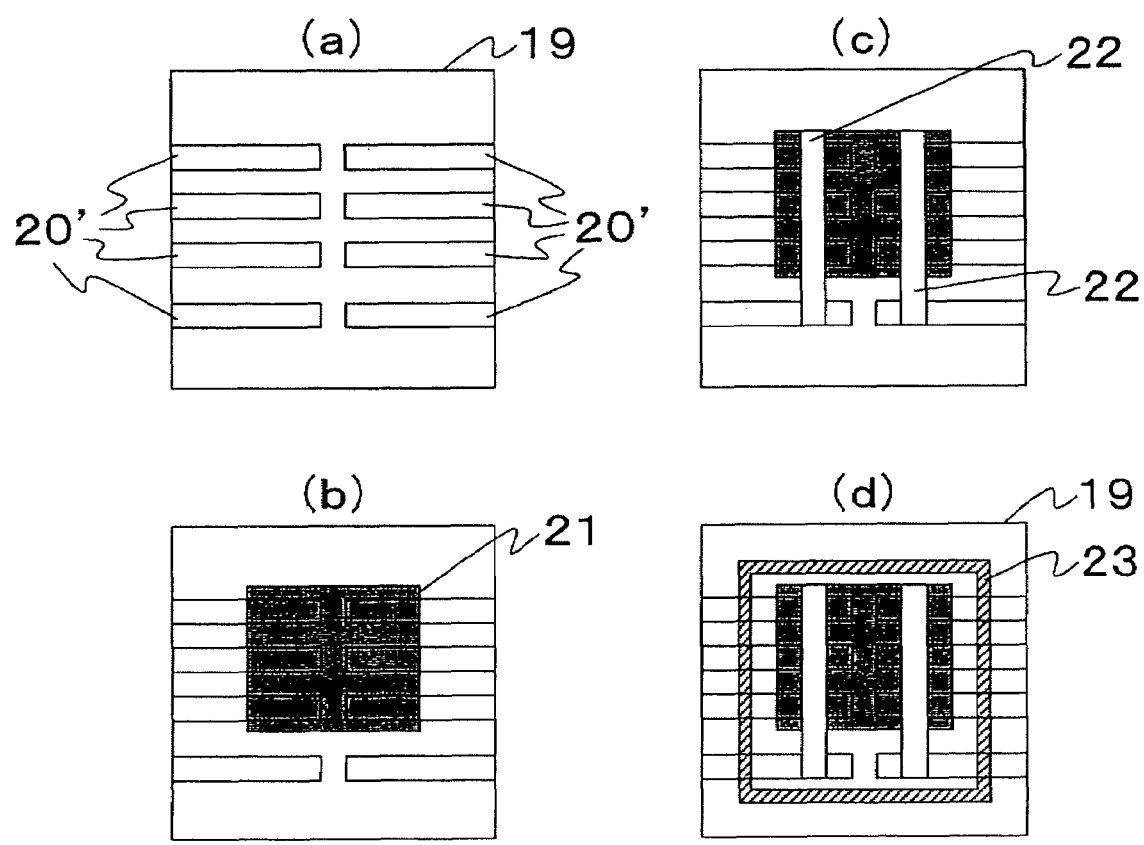
FIG. 4(a) to FIG. 4(d) show the patterning of the components of the organic electroluminescence device according to the present invention.

The substrate, which had undergone the step of the formation of the second electrode (22) at step 5 in FIG. 3, was transferred to the passing box (31) shown in FIG. 5 with the vacuum state maintained. After the gate valves were closed, the pressure was returned to the atmospheric pressure with high-purity dry nitrogen (a nitrogen purity of 6 N, a zero point of $-90°$ C., an oxygen concentration of 0.01 ppm or lower) Thereafter, the substrate was transferred to the sealing box (32) previously filled with the same high-purity dry nitrogen.

Next, at step 6, a sealing container (23) was attached. The sealing container (23) was made of borosilicate glass (manufactured by NSG glass components Co., Ltd.). Although not shown particularly, it has an internal concave to which calcium oxide (manufactured by SAES Getters Co., Ltd.) is attached as a dryer.

The sealing container (23) was attached onto the substrate (19) at the position as shown in FIG. 4(d). An ultraviolet curing epoxy resin (manufactured by Three Bond Co., Ltd.) was applied to the end of the sealing container (23) corresponding to the attachment point. The substrate and the sealing container were bonded at the predetermined position, and in this state, ultraviolet rays were irradiated to realize photocuring.

Then, the sealed substrate was again transferred to the passing box (31). The gate valve (35) between it and the sealing box (32) was closed. The sealed substrate was taken to the outside of the equipment from a device outlet (36).

Since the epoxy resin was not sufficiently cured at this point, the sealed substrate was transferred to another resin curing oven to perform post-cure at $80°$ C. for one hour to complete the curing. In this manner, a series of device forming steps was finished.

FIG. 4(d) shows the arrangement of respective components of an organic electroluminescence system in which the organic electroluminescence devices according to the present invention are arranged in matrix. The substrate (19) has a size of five centimeters per side on which eight metal oxide electrodes (20') are formed, for example.

The organic substance-containing thin film layer (21) is arranged to cover part of the metal oxide electrode (20'). The second electrode (22) formed thereon is arranged to be orthogonal to the metal oxide electrode (20'). One end of the second electrode (22) is in direct contact with the metal oxide electrode (20') since the organic substance-containing thin film layer (21) is not formed there. These are sealed by the sealing container (23).

In FIG. 4(d), the area serving as the organic electroluminescence device which emits light is the overlap of the three components, that is, the metal oxide electrode (20'), the organic substance-containing thin film layer (21), and the second electrode (22). By way of example, six emission portions are present and will hereinafter be referred to as pixels.

To realize emission in a predetermined pixel, the metal oxide electrode (20') associated with that pixel is selected as an anode, the second electrode (22) associated with that pixel is selected as a cathode, and a voltage is applied thereto to flow a current, thereby achieving the emission. Such selection can be sequentially performed to realize emission in all pixels. The metal oxide electrode (20') in direct contact with the second electrode (22) is used as the cathode.

Next, description will be made of a surface treatment mechanism when the substrate after the patterning is subjected to the substrate surface treatment in the pretreatment chamber (28) shown in FIG. 5.

Figure 6:
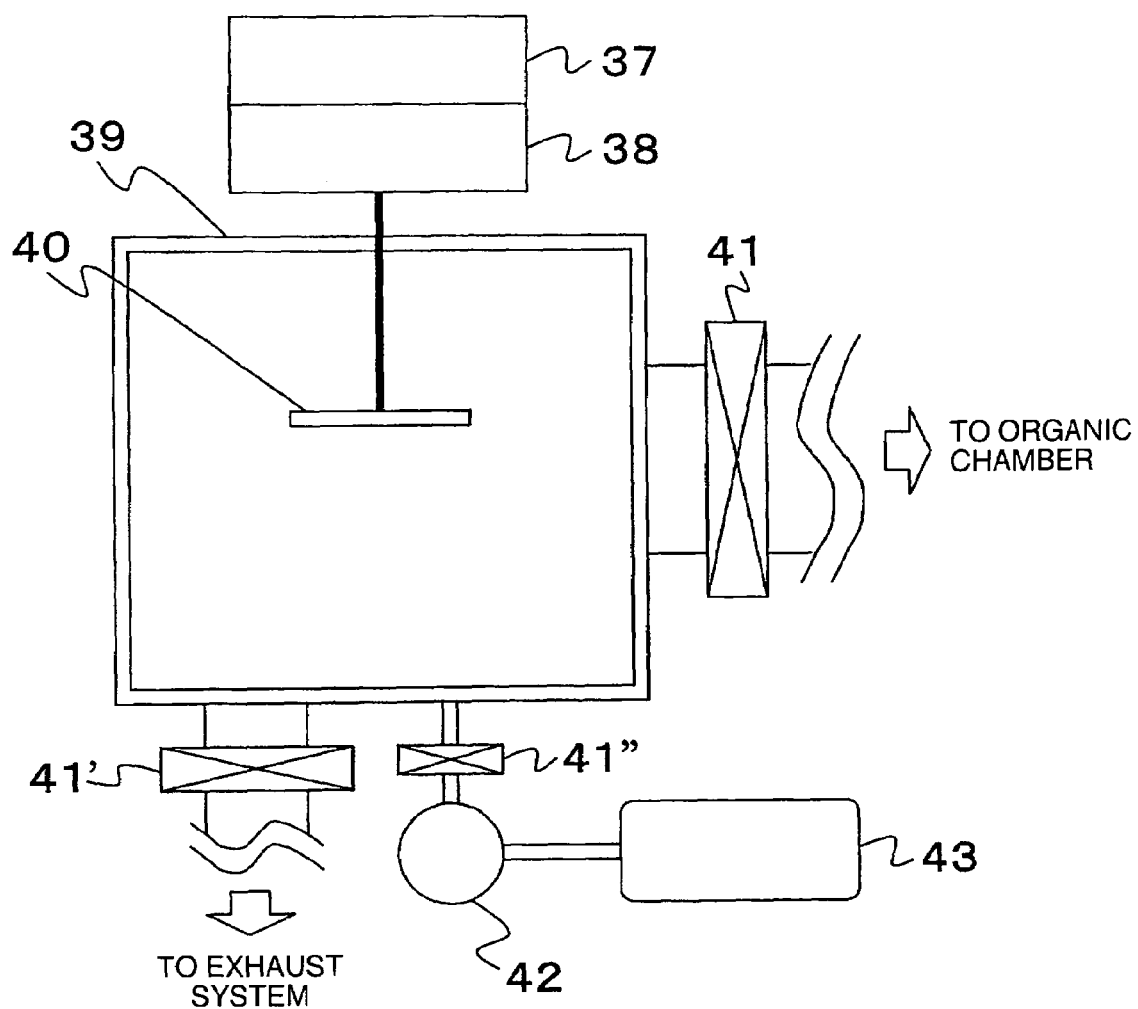
FIG. 6 shows the structure of a pretreatment chamber of the equipment shown in FIG. 5.

In FIG. 6, a pretreatment chamber (39) includes a substrate holding mechanism (40) for holding a substrate put thereinto. The pretreatment chamber (39) is connected to the organic chamber via a gate valve (41). The pretreatment chamber (39) is also connected to an exhaust system via a gate valve (41').

For performing the surface treatment on the substrate put thereinto, high-frequency plasma is produced by using a high-frequency electric power source (37) (JRF-300 manufactured by JEOL Ltd.) and a matching box (38) (EH-MN01M manufactured by JEOL Ltd.). A high-purity gas ($O_2$, $H_2$, Ar, $N_2$, and a mixture of them) is flowed to the chamber (39) at a predetermined pressure from a gas cylinder (43) connected thereto via a gate valve (41") and a gas regulator (42) to produce the gas plasma on the substrate surface.

Various types of plasma treatment can be performed by changing the conditions such as the gas type, the mixture ratio, the flow rate, or the high-frequency electric power source output to adjust the composition on the surface of the metal oxide electrode.

Next, description will be made of how to analyze and evaluate the composite ratio of the metal oxide electrode from the carrier injection surface through the bulk layer thereof. The following two analysis methods were used.

One of them is X-ray Photoelectron Spectroscopy (XPS) and the other is an Auger Electron Spectroscopy (AES).

The XPS analysis was performed under the following conditions. An XPS apparatus AXIS-HS manufactured by Shimadzu Corporation/Kratos Analytical Limited was used as an analyzer. For spectrum conditions, a monochrome Al (with a tube voltage of 15 kV, a tube current of 15 mA) was used as an X-ray source, a lens condition of 30 mmf (with an analyzing area of 30 mmf), pass energy of 40 as a resolution, and a scan speed of 20 eV/min were used.

Ion gun setting conditions included an accelerating voltage of 2.5 kV, an excitement current of 15 mA, an Ar gas pressure of $3 \times 10^{-5}$ Pa, a beam size as manual, a raster size of 2 mm×2 mm. An etching rate with Ar gas was 1.5 nm/min in terms of $SiO_2$.

The AES analysis was performed under the following conditions. An AES apparatus PHI650 manufactured by Perkin-Elmer Co., Ltd. was used as an analyzer. The electron gun (thermal radiation type) setting conditions included an accelerating voltage of 2.0 kV, a beam current of 70 nA, a beam diameter of 1 mm or smaller, an analysis area of 20 mm×20 mm, and a sample tilt of 60 degrees.

Ion gun setting conditions included an accelerating voltage of 3.0 kV, an excitement current of 25 mA, an Ar gas pressure of $15 \times 10^{-5}$ Pa, a raster size of 3 mm×3 mm, and a sample tilt of 60 degrees. An etching rate with Ar gas was 1.5 nm/min in terms of $SiO_2$.

Next, description will be made of how to analyze the surface roughness of the metal oxide electrode. An Atomic Force Microscopy (AFM) was used for the surface roughness analysis.

NS3-257 manufactured by Digital Instruments (Ver. 3.20) was used as an analyzer. The analysis was performed with $Si_3N_4$ as a probe, in the air as the measurement atmosphere, with an observation area of 1×1 mm. Evaluations were made on a square average surface roughness Rq in the observation area, an average surface roughness Ra, a 10-score average surface roughness Rz, and a maximum $R_{max}$ on a Z axis.

Next, description will be made of how to analyze the work function of the surface of the metal oxide electrode. AC-1 manufactured by RIKEN KENKI Co., Ltd. was used as an analyzer, in the air as the measurement atmosphere, with a deuterium lamp as an excitement light source, and an excitement energy band of 3.4 to 6.2 eV.

Since the work function on the surface easily changes in the air, the measurement was performed as close to the pretreatment chamber (39) as possible within five minutes after the completion of the surface treatment.

Next, description will be made of how to evaluate the organic electroluminescence characteristics of the finished organic electroluminescence device. The emission characteristics of the organic electroluminescence device (in other words, the relationship between the current density and the emitted light brightness with respect to applied voltage) were evaluated by using a brightness photometer (a handy brightness photometer LS-110 manufactured by KONICA MINOLTA) and a precise electric power/current meter (manufactured by Hewlett-Packard).

The measurement was performed in two directions of voltage application, that is, when the voltage was increased in a positive direction in increments of 0.2 V beginning with 0 V (hereinafter referred to as a forward bias direction) and when the voltage was decreased in a negative direction (hereinafter referred to as a reverse bias direction).

The current (and the current density normalized for a pixel area) and the emitted light brightness were measured when a predetermined voltage was applied. To provide stable values indicated by the brightness photometer, the current and the brightness two seconds after the voltage application were used as measurement values at that point.

Figure 7:
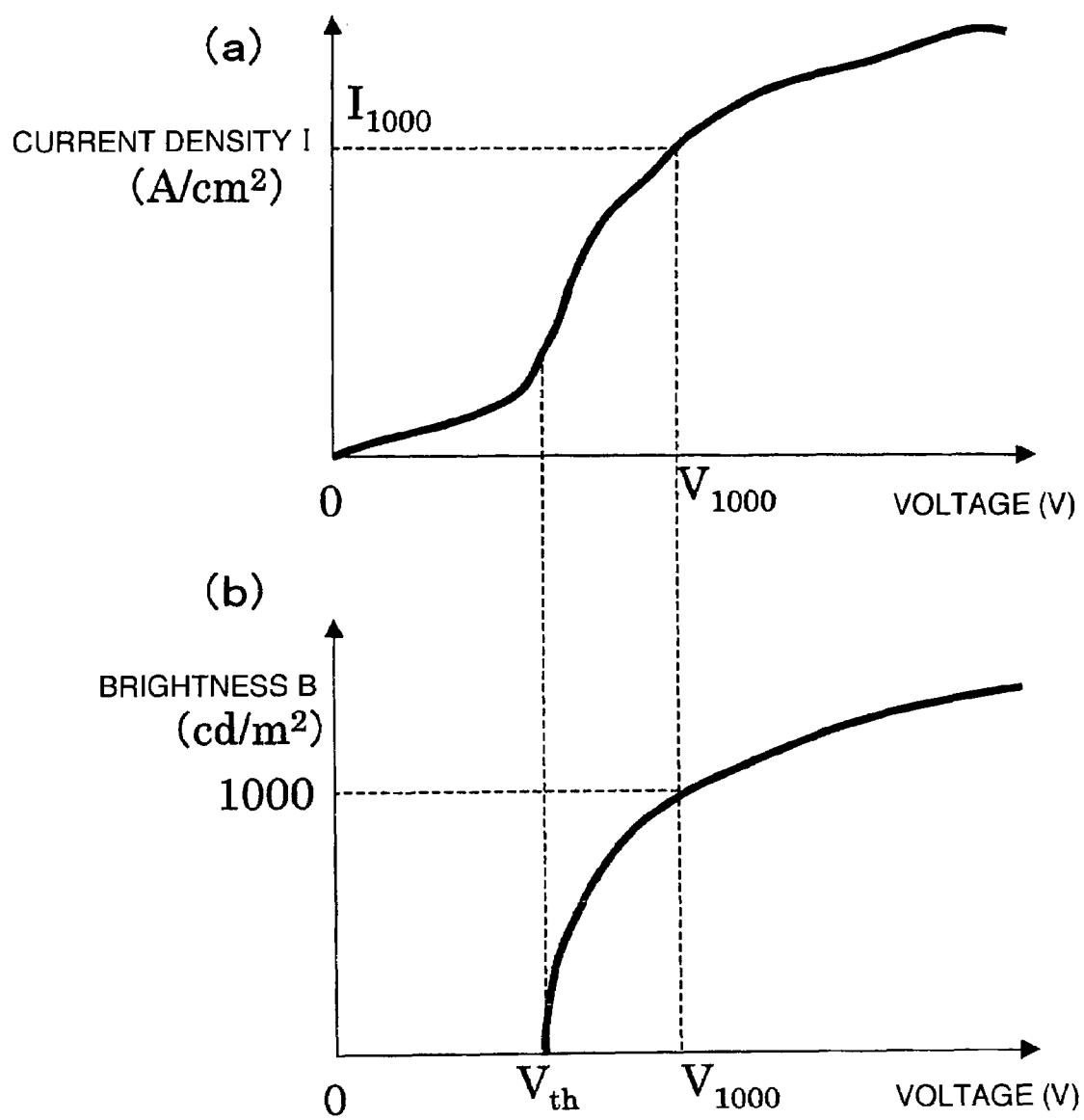
FIG. 7(a) and FIG. 7(b) are graphs showing representative emission characteristics of the organic electroluminescence device.

FIGS. 7(*a*) and 7(*b*) schematically show representative emission characteristic. FIG. 7(*a*) shows the relationship between the current density and the voltage. FIG. 7(*b*) shows the relationship between the brightness and the voltage. The organic electroluminescence device is a type of light-emitting diode, in which an increase in voltage in the forward bias direction beginning with 0 V gradually increases the current amount. When a certain voltage is reached, the current amount is sharply increased to start light emission.

The voltage at that point was called a voltage threshold ($V_{th}$). As the voltage continued to increase, the current amount was increased significantly, and accordingly, the amount of emission was increased. To specify the characteristics in the area in which sufficient emission was seen, the current density and the voltage when the emission amount reached 1000 cd/m$^2$ were represented as $I_{1000}$, and $V_{1000}$, respectively.

The electroluminescence spectrum of the organic electroluminescence device and the distribution of luminescence in the pixel were measured by using a fluorescence microscope (with an epifluorescence device Y-FL manufactured by Nikon Corporation as a microscope, and AQUACOSMOS U7 501 manufactured by Hamamatsu Photonics K.K. as a spectroscopic system). The measurement was performed with a wavelength of 380 to 800 nm and a resolution of 0.1 nm.

The life characteristic of the organic electroluminescence device was evaluated in the following method. A d.c. power source (DC voltage current source/meter manufactured by Advantest Corporation) was used as the power source. A brightness photometer (BM-7 fast manufactured by Topcon Corporation) was used for measuring the light amount.

The emission characteristics were previously evaluated to measure the characteristic current density $I_{1000}$ at which the brightness 1000 cd/m$^2$ was provided. The characteristic current density $I_{1000}$ was applied at a constant current by the d.c. power source to cause a pixel of interest to emit light through the current. The brightness and voltage were measured over time.

In the measurement, initial variations are seen in which the brightness is once increased in an hour after several seconds immediately after the start and then gradually reduced, or the voltage is once reduced and then gradually increased. Thus, even when the life measurement is started at the constant current corresponding to the brightness of 1000 cd/m$_2$, the value does not reach that value in many cases.

In view of the situations, the life characteristics of various organic electroluminescence devices were evaluated with a relative brightness $B/B_{max}$ normalized for the maximum brightness $B_{max}$ and a relative voltage $V/V_{min}$ normalized for the minimum voltage $V_{min}$ in the range of several hours after the passing of electrical current.

Figure 8:
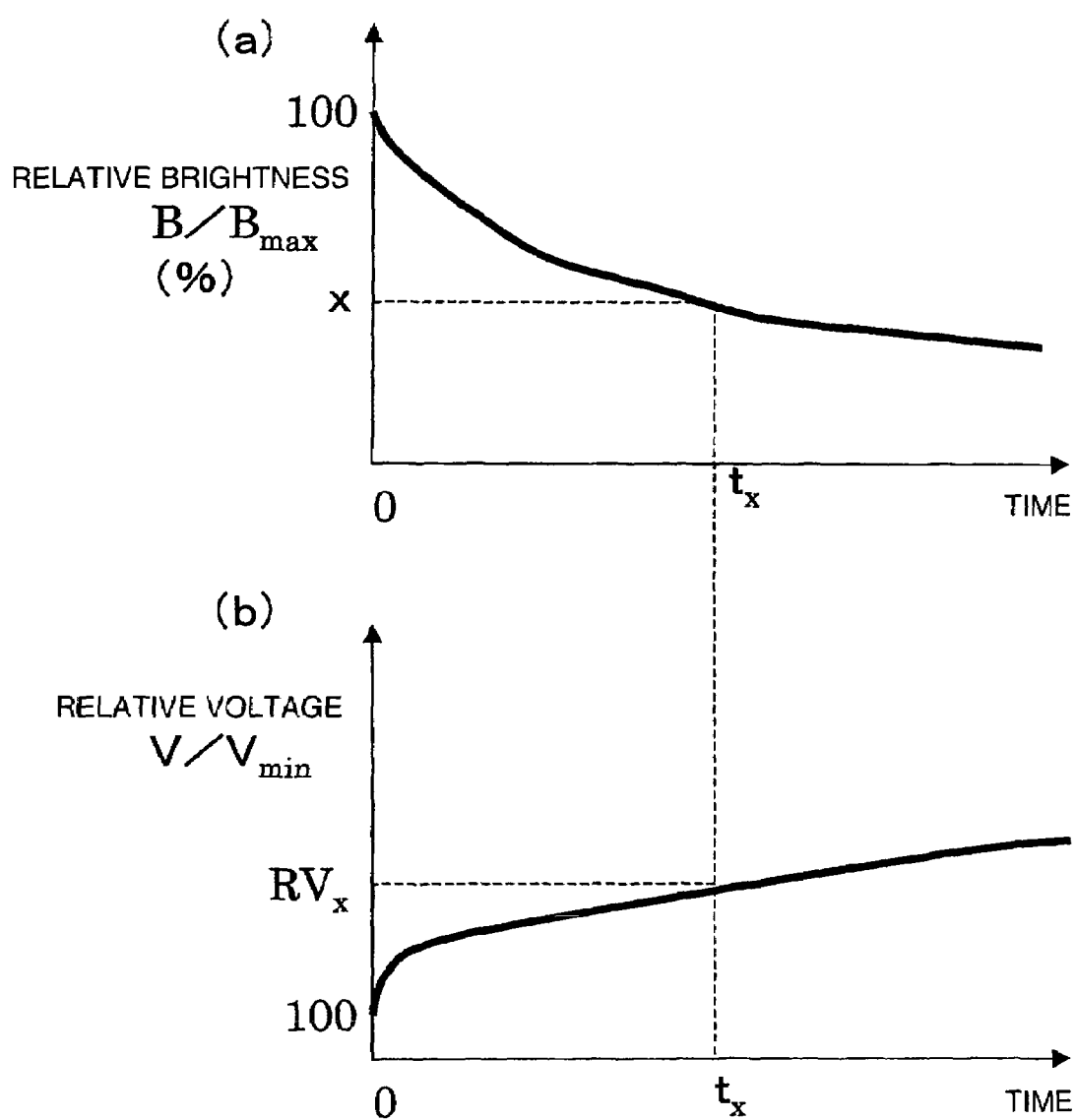
FIG. 8(a) and FIG. 8(b) are graphs showing representative life characteristics of the organic electroluminescence device.

FIGS. 8(a) and 8(b) schematically show representative life characteristics. FIG. 8(a) shows the brightness change, while FIG. 8(b) shows the voltage change. The life characteristics of respective organic electroluminescence devices were compared by using a time $t_x$ when the relative brightness is at X% and a relative voltage $RV_x$ at that point. As the value $t_x$ is higher, the life is longer. As the value $RV_x$ is lower, the voltage increase is smaller.

Next, description will be made of the results of the comparison and consideration of the various characteristics of the provided devices with the abovementioned evaluation means.

Table 1 shown below provides the characteristics of the metal oxide electrode (written as ITO-H in Table 1) made of ITO formed by using the abovementioned equipment. Table 1 shows the result of the analysis of the change in composite ratio of elements forming the metal oxide electrode from the surface through the bulk layer thereof. The metal oxide electrode was formed in the device subjected to the various types of substrate surface treatment (plasma treatment 1A to 1C in Table 1) in the pretreatment chamber (39) by the XPS. Table 1 also shows the work function and the surface roughness on the electrode surface (Rz: an average of 10 values), the emission characteristics ($V_{th}$, $V_{1000}$, and $I_{1000}$), and the life characteristics (X, $t_x$, and $RV_x$).

TABLE 1

| metal oxide electrode | plasma treatment | composite ratio of compounds (%) | sputter time (min) | | | | | work function (eV) | surface roughness Rz (nm) |
|---|---|---|---|---|---|---|---|---|---|
| | | | 0 | 0.5 | 1 | 2 | 4 | | |
| ITO-H | 1A | In | 30.1 | 44.1 | 44.4 | 44.3 | 44.5 | 4.6 | 7.640 |
| | | Sn | 2.3 | 3.3 | 3.3 | 3.3 | 3.3 | | |
| | | O | 43.5 | 50.7 | 51.1 | 51.2 | 51.1 | | |
| | | C | 24.2 | 1.8 | 1.2 | 1.2 | 1.1 | | |
| | | total | 100.0 | 100.0 | 100.0 | 100.0 | 100.0 | | |
| | | Sn/(In/2) (%) | 15.02 | 15.14 | 14.93 | 14.97 | 14.83 | | |
| ITO-H | 1B | In | 29.5 | 45.1 | 44.8 | 45.5 | 45.3 | 5.0 | 7.487 |
| | | Sn | 1.5 | 3.0 | 3.2 | 3.2 | 3.1 | | |
| | | O | 48.7 | 50.8 | 51.1 | 50.3 | 50.8 | | |
| | | C | 20.3 | 1.0 | 0.9 | 1.0 | 0.8 | | |
| | | total | 100.0 | 100.0 | 100.0 | 100.0 | 100.0 | | |
| | | Sn/(In/2) (%) | 10.26 | 13.51 | 14.35 | 14.07 | 13.69 | | |
| ITO-H | 1C | In | 25.0 | 45.3 | 45.5 | 45.3 | 45.1 | 4.4 | 8.021 |
| | | Sn | 1.1 | 2.8 | 2.9 | 3.1 | 3.1 | | |
| | | O | 45.2 | 50.5 | 50.8 | 50.9 | 51.0 | | |
| | | C | 28.7 | 1.4 | 0.8 | 0.7 | 0.8 | | |
| | | total | 100.0 | 100.0 | 100.0 | 100.0 | 100.0 | | |
| | | Sn/(In/2) (%) | 8.80 | 12.36 | 12.75 | 13.69 | 13.75 | | |

| metal oxide electrode | plasma treatment | emission characteristics | | | life characteristics | | |
|---|---|---|---|---|---|---|---|
| | | $V_{th}$ (V) | $V_{1000}$ (V) | $I_{1000}$ (A/cm²) | x (%) | tx (hr) | RVx (%) |
| ITO-H | 1A | 3.0 | 7.3 | 0.018 | 90 | 305 | 108.0 |
| | | | | | 80 | 930 | 111.5 |
| | | | | | 70 | 2,160 | 118.7 |
| | | | | | 60 | 3,740 | 122.7 |
| | | | | | 50 | 4,830 | 128.1 |
| | | | | | 40 | 6,620 | 130.5 |
| ITO-H | 1B | 3.0 | 9.1 | 0.023 | 90 | 42 | 104.0 |
| | | | | | 80 | 220 | 109.1 |
| | | | | | 70 | 700 | 116.5 |
| | | | | | 60 | 1,410 | 120.4 |
| | | | | | 50 | 3,640 | 130.6 |
| | | | | | 40 | 5,010 | 132.2 |
| ITO-H | 1C | 2.8 | 7.3 | 0.010 | 90 | 1 | 101.0 |
| | | | | | 80 | 4 | 100.5 |
| | | | | | 70 | 380 | 145.0 |
| | | | | | 60 | 620 | 160.0 |
| | | | | | 50 | 950 | 166.0 |
| | | | | | 40 | 1,550 | 173.0 |

First, the changes in composite ratio of compounds forming the metal oxide electrode from the surface through the bulk layer are compared. The three types of the metal oxide electrode include In, Sn, O constituting ITO, and C resulting from organic contamination.

Table 1 shows the ratio of the four elements such that the total value is equal to 100%. The sputter time in Table 1 represents a sputter time with Ar gas in the analysis by the XPS with an etching rate of 1.5 nm/min in terms of $SiO_2$.

The composite ratios of the elements forming the respective metal oxide electrodes are substantially uniform when the sputter time is equal to or longer than one minute (a deepness of 1.5 nm or more in terms of $SiO_2$), although some variations are seen.

Of the elements, C results from the organic contaminant on the surface and drastically reduces toward a deeper section in the bulk layer (approximately 1% is detected from recontamination in the sputtering within the equipment). C is not an original element of the electrode and should be removed by various cleaning means.

In contrast, O in Table 1 includes oxygen as an original element of the IO electrode and oxygen contained in the organic contaminant on the surface, as well as oxygen resulting from water absorbed in the surface.

To examine whether or not the original elements of the ITO electrode maintain the uniform ratio in the bulk layer and the outermost layer, the ratio of In and Sn, which are elements other than the oxygen in the ITO, was compared as the percentage ratio of Sn/(In/2). The comparison showed that the composite ratio of In and Sn varies depending on the treatment.

For example, in the plasma treatment 1C, the ratio Sn/(In/2) is 8.80% at the surface, changes to 12.36%, 12.75%, 13.69%, and 13.75% toward a deeper section in the bulk layer. In the plasma treatment 1B, the ratio Sn/(In/2) is 10.26% at the surface, changes to 13.51%, 14.35%, 14.07%, and 13.69% toward a deeper section in the bulk layer. Roughly speaking, in both cases, the ratio of Sn is lower than the ratio of In at the electrode surface, and the ratio of Sn is increased toward a deeper section in the bulk layer until it reaches substantially constant values from 13 to 14%.

In the plasma treatment 1A, the ratio Sn/(In/2) is 15.02% at the surface, changes to 15.14%, 14.95%, 14.97%, and 14.83% toward a deeper section in the bulk layer. The ratio of Sn is constant at approximately 15% from the surface through the bulk layer. The average at the five points is 14.982%. The ratio on the outermost layer shows a small variation of +0.3% relative to the average. In contrast, in the plasma treatment 1B, the average is 12.27%, and the ratio on the outermost layer is −28% relative to the average. In the plasma treatment 1C, the average is 13.176%, and the ratio on the outermost layer is −22% relative to the average.

In this manner, the metal oxide electrodes can have different composite ratios of the elements on the outermost surfaces depending on the plasma surface treatment even when the electrodes are based on the same ITO.

Next, the work functions of the metal oxide electrodes will be examined. In the plasma treatment 1A to 1C, the work functions are 4.6, 5.0, and 4.4 eV, respectively. The surface roughnesses (Rz, an average of 10 values) are 7.640, 7.487, and 8.012 nm.

For an anode of the organic electroluminescence device, it is typically said that, as it has a higher work function, holes are more easily injected into the device with a higher efficiency, and that as it has a smaller surface roughness, the device is more stable is formed with less leak current. Thus, in Table 1, it is expected that the plasma treatment 1B provides a device with a long life and high efficiency since the work function is the highest and the flatness is the highest.

Next, comparison will be made in the emission characteristics and the life characteristics of these devices. In the emission characteristics, the emission start voltage ($V_{th}$) ranges from 2.8 to 3.0 V, in which the plasma treatment 1C shows the slightly smaller value.

The voltage corresponding to the brightness of 1000 cd/m² is 9.1 V in the plasma treatment 1B, which is larger than 7.3 V in the other treatment types. The current densities at those voltages are 0.018, 0.023, and 0.010 A/cm² in the plasma treatment 1A to 1C, respectively, with the plasma treatment 1B showing the highest value. In this manner, in the emission characteristics, the plasma treatment 1B shows the higher voltage but the plasma treatment 1A and 1C show substantially the same values.

In contrast, in the life characteristic comparison, half-brightness time (the time in which the relative brightness reaches 50%) is 950 hours, which is the shortest, in the plasma treatment 1C, and the plasma treatment 1B shows the second shortest, 3640 hours, and the plasma treatment 1A shows 4830 hours.

When the changes in brightness and voltage are examined, characteristic behavior can be seen. Specifically, the plasma treatment 1C with the shortest life takes only one hour to reach the relative brightness of 90% and takes only four hours to reach 80%, and then the brightness reduction is slowed. The relative voltage continues to increase and shows an increase of 160% at the half-brightness time.

In contrast, the plasma treatment 1B with the second shortest life shows a smaller initial brightness reduction than in the plasma treatment 1C. The plasma treatment 1A with the longest life shows an even smaller initial brightness reduction which means a long life generally, and shows a voltage increase rate slightly smaller than in the plasma treatment 1B.

As described above, the different types of plasma surface treatment on the metal oxide electrode change the composite ratio of the elements forming the electrode from the surface toward a deeper section in the bulk layer. The electrode with a smaller change in the composite ratio has a longer life.

The causes thereof have not been clarified at the present time. A likely explanation is that the composite ratio of the elements forming the metal oxide electrode is uniform from a deeper section to the outer surface, and since the composition of the bulk layer of the metal oxide is the most stable stoichiometrically, different composition localized on the surface may electrochemically decompose and disperse an unstable element on the surface.

Comparative Example

Next, description will be made of a Comparative Example for comparing various characteristics by using a commercially available ITO substrate.

A polished ITO manufactured by Asahi Glass Co., Ltd. (abbreviated as ITO-A) was used as the commercially available ITO. An underlying glass substrate was made of borosilicate glass AN100 similarly to Embodiment 1 with a thickness of 0.7 mm. The ITO layer was made of a polycrystal ITO with a thickness of 150 nm.

The ITO substrate underwent substrate cleaning step identical to that in Embodiment 1 to provide the metal oxide electrode (20) at step 2 shown in FIG. 3. The substrate was then subjected to the patterning step of the metal oxide electrode and the pretreatment for the substrate identical to those in Embodiment 1, then steps including the formation of an organic substance-containing thin film layer, the formation of a second electrode, and sealing with a sealing container, thereby forming an organic electroluminescence device.

Thus, Comparative Example differs from Embodiment 1 in that the underlying metal oxide electrode was a commercially available product, and the various types of surface treatment were performed thereon. Table 2 shows various physical properties, the emission characteristics, and the life characteristics of the metal oxide electrode of the device.

TABLE 2

| metal oxide electrode | composite treatment | ratio of compounds (%) | sputter time (min) | | | | | work function (eV) | surface roughness Rz (nm) |
|---|---|---|---|---|---|---|---|---|---|
| | | | 0 | 0.5 | 1 | 2 | 4 | | |
| ITO-A | 1C | In | 31.1 | 43.6 | 44.3 | 44.5 | 43.7 | 5.1 | 0.915 |
| | | Sn | 2.6 | 3.2 | 3.1 | 3.0 | 3.0 | | |
| | | O | 46.2 | 51.8 | 51.3 | 51.2 | 52.1 | | |
| | | C | 20.1 | 1.4 | 1.3 | 1.3 | 1.2 | | |
| | | total | 100.0 | 100.0 | 100.0 | 100.0 | 100.0 | | |
| | | Sn/(In/2) (%) | 16.72 | 14.68 | 14.00 | 13.48 | 13.73 | | |
| ITO-A | 1B | In | 31.3 | 44.0 | 44.3 | 45.1 | 45.2 | 5.6 | 0.902 |
| | | Sn | 2.6 | 3.2 | 3.1 | 3.0 | 3.1 | | |
| | | O | 44.5 | 52.1 | 51.9 | 51.2 | 50.9 | | |
| | | C | 21.6 | 0.7 | 0.7 | 0.7 | 0.8 | | |
| | | total | 100.0 | 100.0 | 100.0 | 100.0 | 100.0 | | |
| | | Sn/(In/2) (%) | 16.61 | 14.55 | 14.00 | 13.30 | 13.72 | | |

| metal oxide electrode | treatment | emission characteristics | | | life characteristics | | |
|---|---|---|---|---|---|---|---|
| | | $V_{th}$ (V) | $V_{1000}$ (V) | $I_{1000}$ (A/cm$^2$) | x (%) | tx (hr) | RVx (%) |
| ITO-A | 1C | 2.8 | 6.8 | 0.031 | 90 | 40 | 104.1 |
| | | | | | 80 | 210 | 107.2 |
| | | | | | 70 | 620 | 110.0 |
| | | | | | 60 | 1,080 | 112.3 |
| | | | | | 50 | 1,710 | 118.0 |
| | | | | | 40 | 2,730 | 121.5 |
| ITO-A | 1B | 2.8 | 9.0 | 0.010 | 90 | 1 | 100.1 |
| | | | | | 80 | 2 | 100.5 |
| | | | | | 70 | 58 | 101.5 |
| | | | | | 60 | 430 | 109.8 |
| | | | | | 50 | 810 | 111.2 |
| | | | | | 40 | 1,290 | 114.0 |

First, the composite ratios of elements forming the metal oxide electrodes are compared. In, Sn, O, and C were detected in the ITO electrode, similarly to Embodiment 1. The composite ratios of the elements are substantially uniform for a sputter time of 1 minute or longer.

Similarly to Embodiment 1, when the ratio of Sn and In is noted to examine the composite ratio on the outermost surface, a value on the order of 16% is seen in both of the two types of surface treatment in Comparative Example, showing a high ratio of Sn as compared with 13 to 14% in a deeper section in the bulk layer of the metal oxide electrode.

In both of the treatment types of Comparative Example, the composite ratio of the elements was not uniform from the surface through a deeper section in the bulk layer of the metal oxide electrode unlike Embodiment 1. It should be noted that the composite ratios of the elements in the bulk layers with a sputter time of 1 minute or longer were substantially the same as those in Embodiment 1, and the composition other than the outermost surface determines the characteristics of the electrodes.

The work functions were 5.1 and 5.6 eV in the treatment 1C and 1B, respectively. The surface roughnesses were 0.915 and 0.902 nm, respectively.

The work functions are larger and the surface roughnesses are significantly smaller than those in the ITO-H in Embodiment 1. It can be expected from the results that the organic electroluminescence device in Embodiment 1 realizes a stable device with high efficiency of hole injection and little possibility of leak current.

Next, comparison will be made in the emission characteristics and the life characteristics. In the emission characteristics, the emission start voltage is 2.8 eV which is substantially the same as in Embodiment 1. However, the voltage $V_{1000}$ and the current density $I_{1000}$ corresponding to the brightness of 1000 cd/m$^2$ differ from those in Embodiment 1 and are 6.8 V and 0.031 A/cm$^2$ in the treatment 1C and 9.0 V and 0.010 A/cm$^2$ in the treatment 1B.

In the life characteristics, the device with the smallest $V_{1000}$ (ITO-H/plasma treatment 1C) has a shorter life than the device with the largest $V_{1000}$ (ITO-H/plasma treatment 1B) in Embodiment 1, but the ITO of Comparative Example provides the opposite result and the plasma treatment 1C shows a smaller reduction in brightness.

The voltage increase rates are substantially the same in both of the treatment 1B and 1C except that the treatment 1C shows a slightly larger initial increase rate. The lives in both cases are shorter than that in the device with the longest life of Embodiment 1.

In this manner, Comparative Example shows the shorter lives as compared with Embodiment 1 in which the composite ratio of the element forming the metal oxide electrode was uniform from the outermost surface through a deeper section in the bulk layer. Particularly, when the ratio of Sn is high on the outermost surface in the ratios of Sn and In, unlike Embodiment 1, somewhat complicated behavior is seen.

When the composite ratio of the metal oxide electrode cannot be held uniform from the surface through the bulk layer as in Embodiment 1, a longer life cannot be provided even when the metal oxide electrode in the bulk layer has a substantially uniform composite ratio.

Example 2

Next, description will be made of the results of the examinations similar to those in Embodiment 1 for an organic electroluminescence device including a different organic substance-containing thin film layer.

Embodiment 2 employed a device made of two organic layers, αNPD and Alq$_3$, selected as a device including a simpler organic substance-containing thin film layer. Both of the used αNPD and Alq$_3$ were products manufactured by Nippon Steel Corporation. A metal oxide electrode and surface treatment thereof were the same as those in Comparative Example except that plasma treatment 1A was performed on ITO-H.

The device was formed by putting αNPD with a thickness of 50 nm on the metal oxide electrode in the same manner as in Embodiment 1, putting Alq$_3$ with a thickness of 50 nm thereon, putting a second electrode (LiF 0.5 nm, Al 150 nm) similar to that in Embodiment 1, and finally sealing them.

Table 3 shows the results of the evaluations of the emission characteristics and the life characteristics on the finished device similarly to Embodiment 1.

TABLE 3

| metal oxide electrode | treatment | emission characteristics | | | life characteristics | | |
|---|---|---|---|---|---|---|---|
| | | $V_{th}$ (V) | $V_{1000}$ (V) | $I_{1000}$ (A/cm$^2$) | x (%) | tx (hr) | RVx (%) |
| ITO-H | 1A | 2.6 | 6.8 | 0.141 | 90 | 0.05 | 100.4 |
| | | | | | 80 | 0.24 | 101.0 |
| | | | | | 70 | 1.37 | 105.2 |
| | | | | | 60 | 3.72 | 107.0 |
| | | | | | 50 | 17.09 | 112.2 |
| | | | | | 40 | 51.04 | 117.8 |
| ITO-H | 1B | 2.6 | 7.0 | 0.143 | 90 | 0.02 | 100.3 |
| | | | | | 80 | 0.10 | 101.0 |
| | | | | | 70 | 0.57 | 105.3 |
| | | | | | 60 | 1.54 | 107.0 |
| | | | | | 50 | 7.11 | 112.3 |
| | | | | | 40 | 21.15 | 117.8 |
| ITO-H | 1C | 2.4 | 6.6 | 0.140 | 90 | 0.01 | 100.3 |
| | | | | | 80 | 0.06 | 100.9 |
| | | | | | 70 | 0.34 | 105.3 |
| | | | | | 60 | 0.93 | 107.0 |
| | | | | | 50 | 4.27 | 112.3 |
| | | | | | 40 | 12.68 | 117.7 |
| ITO-A | 1C | 2.4 | 6.6 | 0.140 | 90 | 0.01 | 100.3 |
| | | | | | 80 | 0.05 | 100.9 |
| | | | | | 70 | 0.28 | 105.2 |
| | | | | | 60 | 0.77 | 106.9 |
| | | | | | 50 | 3.55 | 112.2 |
| | | | | | 40 | 10.55 | 117.7 |

In the emission characteristics of these devices, the emission start voltage ranges from 2.4 to 2.6 V, the voltage corresponding to the brightness of 1000 cd/m$^2$ ranges from 6.6 to 7.0 V, and the current density at that point ranges from 0.140 to 0.143 A/cm$^2$. Thus, a particularly large difference is not found.

In the life characteristics, however, the half-brightness time varies greatly in a range from 3.55 to 17.09 times. Similarly to Embodiment 1, ITO-H subjected to the plasma surface treatment 1A had the largest life.

In the voltage increase, a distinct difference is not seen, and the device structures in Example 2 seem to have substantially the same values.

In this manner, it is found that the uniform composite ratio of compounds forming the metal oxide electrode from the surface toward a deeper section in the bulk layer thereof has certain effects on an extended life of the organic electroluminescence device in Example 2, as in Example 1.

When the devices in Example 2 are compared with those in Example 1, however, their lives are shorter. Thus, it is necessary to select an appropriate organic substance-containing thin film layer to extend the life as well as the metal oxide electrode.

Example 3

Next, description will be made of the results of the estimations of the -optimal range of the composite ratios of the metal oxide electrode according to the present invention with reference to Table 4 shown below. Table 4 again shows the composite ratios of the elements In and Sn in the metal oxide electrodes ITO-H and ITO-A in Tables 1 and 2.

TABLE 4

| metal oxide electrode | treat-ment | sputter time (min) | | | | | average | composite ratio shift at surface |
|---|---|---|---|---|---|---|---|---|
| | | 0 | 0.5 | 1 | 2 | 4 | | |
| | | depth (nm) | | | | | | |
| | | 0 | 0.75 | 1.5 | 3 | 6 | of 1-4 | |
| ITO-H | 1A | 15.02 | 15.14 | 14.93 | 14.97 | 14.83 | 14.91 | 0.72 |
| | 1B | 10.26 | 13.51 | 14.35 | 14.07 | 13.69 | 14.03 | −26.92 |
| | 1C | 8.80 | 12.36 | 12.75 | 13.69 | 13.75 | 13.39 | −34.30 |
| ITO-A | 1C | 16.72 | 14.68 | 14.00 | 13.48 | 13.73 | 13.74 | 21.72 |
| | 1B | 16.61 | 14.55 | 14.00 | 13.30 | 13.72 | 13.67 | 21.51 |

In Table 4, metal oxide electrodes having various composite distributions are provided by combining metal oxide electrodes and surface treatment types as desired. The composite ratios are substantially uniform when the sputter time is long, that is, in a deeper section in the bulk layer of the metal oxide electrode.

Then, the average composition (%) was calculated in a range from 1 to 4 minutes of the sputter time in each combination and was assumed as a composition in the bulk layer of each metal oxide electrode.

The rate of the composite ratio of In and Sn on the outermost surface to the abovementioned value was calculated. ITO-H/1A with the longest life provides 0.72%. In the other metal oxide electrodes with the long lives, ITO-H/1B, ITO-H/1C, ITO-A/1C, and ITO-A/1B provide −26.92, −34.30, 21.72, and 21.51, respectively.

It is seen from those facts that the composite ratio falls within the optimal range when the shift of the composite ratio on the surface relative to that in the bulk layer ranges from −21 to +21%. Thus, when the composite ratio of compounds from the surface through the bulk layer of the electrode formed of metal oxide is 21% or smaller, the composite ratio is considered to be uniform.

In Examples described above, the sputter time was set up to four minutes, and the treatment was performed such that the composite ratio of the metal oxide electrode was substantially uniform. When the depth value in terms of SiO$_2$ is used, the composite ratio is substantially uniform in the range from the surface to the depth of 6 nm at most. In that case, the metal oxide electrode having the characteristics as those in the present invention can be provided.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

When the organic electroluminescence device according to the present invention is used, the out-coupling efficiency $\eta$ext can be enhanced easily without changing the basic structure of the emission section in a number of conventionally reported organic electroluminescence devices. In the conventionally reported organic electroluminescence devices with the same composition, more light can be taken out of the device under the same driving conditions.

Such an increase in efficiency can achieve a reduction in necessary power, optimization of the pixel size, and increased definition, and an extended life of the device.

Particularly, the organic electroluminescence device according to the present invention can be applied to a large-screen display device such as a 10-inch diagonal screen or larger and to a high-definition image display device having a small area. In contrast, the conventional display device provided by an organic material has limited application as an image display device for high definition display and has been proposed as an 8-inch diagonal screen at most.

The enhancement of the electric characteristics of the device can realize a reduction in voltage for driving the device, an increase in brightness, and an extended life of the device.

The invention claimed is:

1. An organic electroluminescence device comprising thin film layers sandwiched between electrodes,
   wherein at least one of the thin film layers is an organic emission layer and at least another one of the at least one thin film layers is a fluorescent or phosphorescent layer, positive and negative carriers being injected through the electrode into and transported in the organic emission layer to cause the organic emission layer to generate light with recombination of a hole and an electron produced from the positive and negative carriers, the fluorescent layer or phosphorescent layer receiving light from the organic emission layer to generate light secondarily, at least one of the electrodes being made of metal oxide into which the positive carriers are injected,
   wherein a composite ratio of compounds from a surface through a bulk layer of at least one of the electrodes made of the metal oxide is uniform.

2. The organic electroluminescence device according to claim 1, wherein a composite ratio of compounds of all elements other than an element attached to a surface of the electrode made of the metal oxide is uniform from the surface through the bulk layer of the electrode made of the metal oxide.

3. The organic electroluminescence device according to claim 1, wherein the bulk layer has a depth of no greater than 6 nm.

4. The organic electroluminescence device according to claim 1, wherein the metal oxide is made of any one of metal elements selected from the group consisting of In, Sn, Zn, Fe, Co, Sr, Cu, Ag, Pt, W, and Ni.

5. The organic electroluminescence device according to claim 1, wherein a surface roughness of the electrode made of the metal oxide is at least 1 nm and is smaller than a film thickness of a thin film layer formed in contact with the metal oxide of the organic electroluminescence device.

6. The organic electroluminescence device according to claim 1, wherein the electrode made of the metal oxide has a work function of no greater than 5.0 eV.

7. An organic electroluminescence system including matrix-arrayed organic electroluminescence devices, the organic electroluminescence device comprising thin film layers sandwiched between electrodes, at least one of the thin film layers being an organic emission layer and at least another one of the at least one thin film layers being a fluorescent or phosphorescent layer, positive and negative carriers being injected through the electrode into and transported in the organic emission layer to cause the organic emission layer to generate light with recombination of a hole and an electron produced from the positive and negative carriers, the fluorescent layer or phosphorescent layer receiving light from the organic emission layer to generate light secondarily, at least one of the electrodes being made of metal oxide into which the positive carriers are injected,
   wherein a composite ratio of compounds from a surface through a bulk layer of at least one electrode made of the metal oxide is uniform.

* * * * *